United States Patent [19]

Denda

[11] Patent Number: 5,278,463
[45] Date of Patent: Jan. 11, 1994

[54] BI-CMOS LOGIC CIRCUIT WITH INVERTER FEEDBACK FOR HIGH SPEED

[75] Inventor: Akira Denda, Tokyo, Japan

[73] Assignee: NEC Corporation, Tokyo, Japan

[21] Appl. No.: 1,552

[22] Filed: Jan. 6, 1993

[30] Foreign Application Priority Data

Jan. 9, 1992 [JP] Japan ..................... 4-20455

[51] Int. Cl.$^5$ ...................... H03K 19/02; H03K 19/08
[52] U.S. Cl. ................................. 307/446; 307/456; 307/443
[58] Field of Search ................. 307/446, 456, 451, 443

[56] References Cited

U.S. PATENT DOCUMENTS

| | | | |
|---|---|---|---|
| 5,001,365 | 3/1991 | Murabayashi et al. | 307/446 |
| 5,057,713 | 10/1991 | Iwamura et al. | 307/446 |
| 5,118,972 | 6/1992 | Wissel et al. | 307/446 |
| 5,173,623 | 12/1992 | Chau et al. | 307/446 |
| 5,191,240 | 3/1993 | Fleischer | 307/446 |

OTHER PUBLICATIONS

"A Subnanosecond BI-CMOS Gate-Array Family", Hiroshi NAKASHIBA et al., IEEE 1986 Custom Integrated Circuits Conference, CH2258-2/86/000-0063, pp. 63-66.

Primary Examiner—Edward P. Westin
Assistant Examiner—Richard Roseen
Attorney, Agent, or Firm—Young & Thompson

[57] ABSTRACT

It is purposed to ensure both high speed operation and low power consumption in an output section of a Bi-CMOS type TTL logic circuit. For this purpose, impedances of a base driving part (a series circuit of a MOS transistor 9 and a resistor 11) and a collector driving part A (a resistor 12) of a bipolar transistor 1 are brought into low impedances only when the bipolar transistor 1 is changed from an off-to on-state thereof. To achieve the just-mentioned operation, potential on an output 30 is detected by an inverter 16 and on the basis of an output from the inverter 16 both MOS transistors 17, 19 are on-controlled to substantially short-circuit the resistors 11, 12. When the transistor 1 stays at its on-state, both transistors 17, 19 have been switched off, so that base and collector currents of the transistor 1 have been conducted through the resistors 11, 12 to permit the resistors 11, 12 to be greater. Thus, low power consumption is attained.

9 Claims, 2 Drawing Sheets 5,278,463

BI-CMOS LOGIC CIRCUIT WITH INVERTER FEEDBACK FOR HIGH SPEED

BACKGROUND OF THE INVENTION

1. Field of the Invention

The present invention relates to a TTL logic circuit, and more specifically to a Bi-CMOS type TTL logic circuit.

2. Description of the Prior Art

Referring now to FIG. 1, an arrangement is illustrated of an output circuit section of a TTL logic circuit having a Schottky diode realized by a Bi-CMOS technique.

An input signal "A" from an input terminal 20 is fed to gate terminals of a P channel MOS transistor 9 and an N channel MOS transistor 5, and a source output from the MOS transistor 9 drives a base of an NPN Schottky barrier diode-equipped bipolar transistor 1 through resistance 11. The MOS transistor 5 disposed between the base of the transistor 1 and ground potential is to quickly discharge electric charges residual on the base of the transistor 1 for speeding-up cut-off operation of the transistor.

The transistor 1 has its collector connected with a resistor 12 through which a collector driving current of the transistor 1 is fed. The transistor 1 further has its emitter connected with one end of a resistor 13 which is further connected with ground at the other end, and connected with a base of an NPN type Shottky barrier diode-equipped bipolar transistor 2 which is driven by an output of the emitter of the transistor 1. The transistor 2 provides a circuit output 30 on its collector. An N channel MOS transistor 6 is provided for quickly discharging residual electric charges remaining on the base of the transistor 2, to a gate of which transistor 6 the input signal "A" is applied.

A low level of the circuit output is determined by the transistors 1 and 2, and a high level of the same is determined by NPN bipolar transistors 3, 4 which are interconnected in Darlington construction. For driving the transistors 3 and 4 are provided an inverter 15 for inverting the input signal "A" and a CMOS inverter (a combination of a P channel transistor 10 and an N channel transistor 7) for further inverting an output of the inverter 15, an output of the CMOS inverter is applied to a base of the transistor 3. An emitter output of the transistor 4 provides the circuit output 30. Herein, the transistor 7 has a function to quickly discharge electric charges residual on the basis of the transistor 3.

For quickly discharging electric charges residual on a base of the transistor 4, an N channel MOS transistor 8 is provided, to a gate of which the output of the inverter 15 is applied. The transistor 4 has its collector connected with a Schottky barrier diode 14 for protecting the transistors 3, 4 when any load (not shown) is short-circuitted.

The above prior art TTL logic circuit is constructed such that the high and low levels of the circuit output 30 are completely isolated by the CMOS transistor to greatly reduce power consumption of the circuit particularly the power upon a high level output being provided.

The prior art circuit is further constructed such that for preventing saturated operations of the transistors 1, 2 upon a low level output being provided both collector potentials are clamped by the Shottky barrier diode and a clamped current is limited by the resistors 11 through 13.

In order to speed up the operation of the prior art circuit the following techniques are considered:

(1) Resistances 11 and 12 are reduced to increase a current flowing through the NPN transistor 1.

(2) The gate width of the P channel MOS transistor 9 is extended to increase the current flowing through the NPN transistor 1.

(3) The gate widths of the N channel MOS transistors 5 through 8 are extended to further speed up the cut-off of the NPN transistors 1 through 4.

(4) The gate widths of the P channel MOS transistor 10 and the N channel MOS transistor 7 are both extended.

The technique (2) is less effective because on-resistance of the P channel MOS transistor 9 is typically several hundred ohms whilst the resistance 11 is several kilo ohms, considerably greater than the on-resistance.

The techniques (3) and (4) are unsuccessful because of an increase of paracitic source-drain capacitance due to the extension of the gate width as well as an increase of the number of elements (an increase of an element area as a result of the extension of the gate width.). It is therefore the present state of the prior art circuit to design a circuit so as to optimize an interrelation between the power consumption and the operating speed using the technique (1).

In the prior art TTL circuit, an interrelation is existent between the power consumption and the operating speed hence it is impossible to satisfactorily improve the operating speed even though the operating speed and the power consumption are made optimum independently.

For instance, in FIG. 1, with the resistances 11 and 12 being reduced the operating speed is improved but simultaneously the power consumption is also increased. A current flowing through the circuit at the low level output being stationary is expressed by:

$$I_{cc} = (V_{cc} - (2V_{BE} - V_{SB}))/R12 + (V_{cc} - 2V_{BE})/R11$$

where $V_{BE}$, denotes base-emitter forward voltages of the NPN transistors 1 and 2, $V_{SB}$ forward voltage of the Schottky barrier diode equipment in the transistors 1, 2, Vcc power supply voltage, and R11 and R12 denote resistance values of the resistors 11 and 12.

A first term on the right side of the above equation denotes a collector current flowing through the NPN transistor 1, and a second term denotes a base current flowing through the NPN transistor 1. It can be seen from the equation that the power consumption is inversely proportional to the resistance values of the resistors 11 and 12, so that an intension to improve the operating speed causes a severe increase of the power consumption. Thus, an effort to yield practical power consumption impedes a satisfactory improvement of the operating speed.

SUMMARY OF THE INVENTION

In view of the drawbacks with the prior art, it is an object of the present invention to provide a TTL logic circuit capable of speeding-up of the operating speed and of reduction of the power consumption.

To achieve the above object, a TTL logic circuit of the present invention comprises a first MOS transistor to a gate of which an input signal is applied, a first resistor connected in series to a conduction channel of said MOS transistor, a predetermined conductivity type first bipolar transistor to which base driving voltage is supplied through a series circuit of said MOS transistor and said first resistor, a second resistor for supplying a collector driving current of said bipolar transistor, a predetermined conductivity type second bipolar transistor, a base of which is driven by an emitter output from said first bipolar transistor and which has its collector connected to a circuit output terminal, and is characterized in that it further comprises output potential detector means for detecting a potential state of said circuit output terminal and first and second variable impedance means each controlled into low or high impedances according to the detected potential state, whereby a base driving current and a collector driving current of said first bipolar transistor are supplied through said first and second variable impedance means.

BRIEF DESCRIPTION OF THE DRAWINGS

The above and other objects, features and advantages of the present invention will better be understood from reading the following description of the preferred embodiments taken in conjunction with the accompanying drawings in which.

BRIEF DESCRIPTION OF PREFERRED EMBODIMENTS

In what follows, the present invention will be described in detail with reference to the accompanying drawings.

Figure 1:
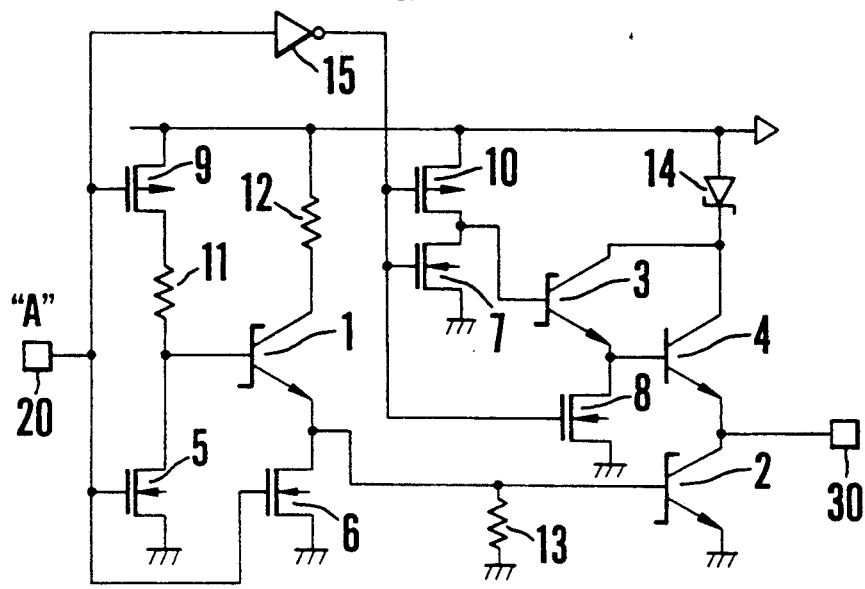
FIG. 1 is an example of a prior art Bi-CMOS type TTL logic circuit.
Figure 2:
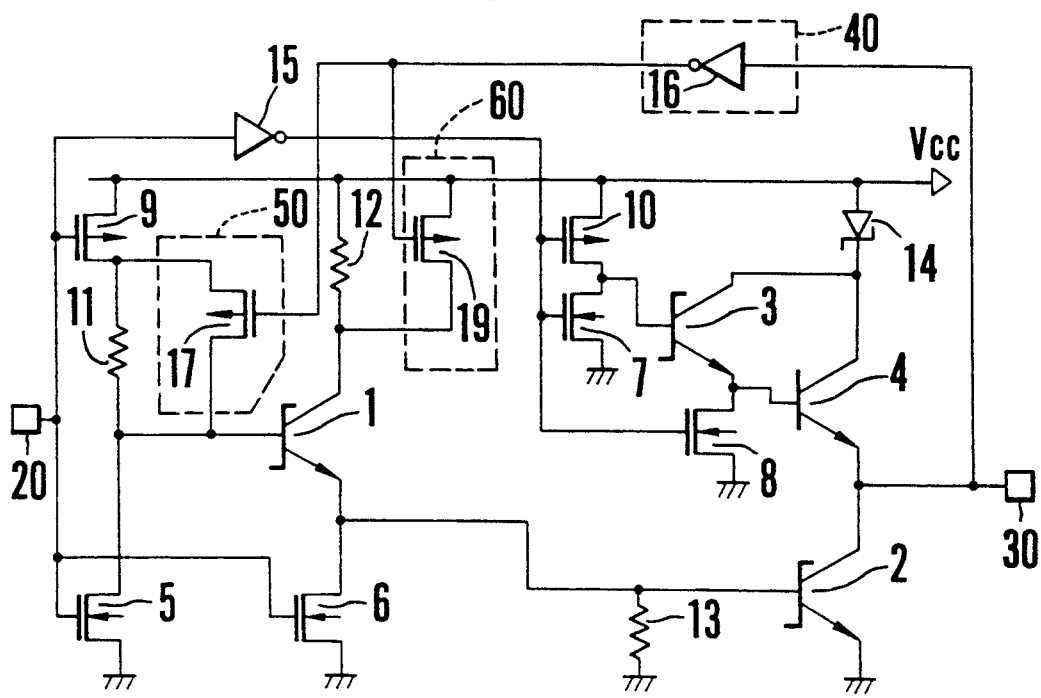
FIG. 2 is a preferred embodiment of a TTL logic circuit according to the present invention.

Referring to FIG. 2, a circuit diagram is provided, illustrating a preferred embodiment of the present invention. Like symbols shall be applied to like portions as those illustrated in FIG. 1. The present embodiment includes the following construction, additionally to that of the prior art circuit of FIG. 1. Namely, there are additionally provided output potential detector means 40 composed of an inverter 16 for detecting potential on the output terminal 30, and first and second variable impedance means 50 and 60 each impedance-controlled by the potential detector means 40.

The first variable impedance means 50 comprises a P channel MOS transistor 17, and an output of the CMOS inverter 16 is supplied to the gate of the transistor 17 which is switched on when the output of the CMOS inverter 16 is of a low level to bring opposite ends of a resistor 11 into a low impedance state.

Likewise, the second variable impedance means 60 comprises a P channel MOS transistor 19, and an output of the CMOS inverter 16 is supplied to the gate of the transistor 19 which is switched on when the output of the CMOS inverter 16 is of a low level to bring opposite ends of a resistor 12 into a low impedance state.

With the above construction, a case is first imagined where a low level signal is inputted to the input terminal 20 and a low level signal is outputted on the output terminal 30. The low level signal on the output terminal 30 inverted by the inverter 16 is fed to gates of the P channel MOS transistors 17, 19, so that they are switched off.

The low level signal has been inputted to the input terminal 20, and hence the P channel MOS transistor 9 has been switched on and the N channel MOS transistors 5, 6 have been switched off. This switches on the transistors 1, 2. At this time, the P channel MOS transistor 9 has been switched on and the P channel MOS transistor 17 has been switched off, so that the base current of the transistor 1 is supplied by a seriescircuit of the transistor 9 and the resistor 11 with the collector current of the transistor 1 supplied by the resistor 12.

The resistances of the resistors 11, 12 can be set so this time to be relatively larger (about 10 kΩ) to permit the Schottky barrier diodes of the transistors 1, 2 to be supplied with a necessary and minimum current enough for the just-mentioned Schottky barrier diodes to be stably clamped.

In succession, once a high level signal is inputted to the input terminal 20, the P channel MOS transistor 9 is switched off and the N channel MOS transistors 5, 6 are switched on to permit the transistors 1, 2 to be switched off.

In contrast, the high level signal on the input terminal 20 is inverted through the inverter 15 and is fed to the gates of the P channel MOS transistor 10 and the N channel MOS transistor 7, 8. Then the P channel MOS transistor 10 is switched on with the N channel MOS transistors 7, 8 switched off. Hereby, the NPN transistors 3, 4 are switched on so that the output terminal 30 becomes a high level.

The high level signal on the output terminal 30 is inverted by the inverter circuit 16 and is fed to the gates of the MOS transistors 17, 19 and hence both transistors 17, 19 are switched on. Further, since the high level signal has been applied to the input terminal 20 and hence the P channel MOS transistor 9 has been switched off and the N channel MOS transisters 5, 6 have been switched on, the transistors 1, 2 have been switched off. At this time, since the transistor 17 has been on but the transistor 9 has been off, the transistor 1 is supplied with no base current.

In this state, once a low level signal is inputted to the input terminal 20, the transistor 9 is switched on with the transistors 5, 6 switched off, so that the transistors 1, 2 are switched on at this time, since the output terminal 30 yet remains at the high level and hence the P channel MOS transistors 17, 19 have been kept at an on-state, the base current of the transistor 1 is supplied chiefly by the transistors 9, 17 and the collector current of the transistor 1 is supplied chiefly by the transistor 19.

In this case, the impedance to drive the transistor 1 becomes very small compared with the stational state where both the input terminal 20 and the output terminal 30 are at the low level. Very high speed operation is therefore expected compared with the prior art of FIG. 1.

Thereafter, once the signal on the output terminal 30 becomes a low level owing to the transistors 1, 2 being on, the signal on the output terminal 30 is inverted by the inverter 16 and is fed to the gate of the transistors 17, 19, and hence both transistors 17, 19 are switched off. Accordingly, the base current of the transistor 1 is supplied through the transistor 9 and the collector current of the transistor 1 is supplied through the resistor 12. Thus, since the inventive circuit is successful in its design where only a necessary and minimum current is driven when the signal on the output terminal 30 becomes stationary at a low level, power consumption can extremely be reduced.

In the TTL circuit of FIG. 2, the on-base current of the transistor 1 is supplied through the P channel MOS transistors 9, 17 upon the state transition from on-to off-state of the transistor 1 for a high speed operation of the TTL circuit. In this case, the gate width of the P channel MOS transistor 9 is needed to be enough large to conduct the on-base driving current and hence an occupation area thereof is increased.

Figure 3:
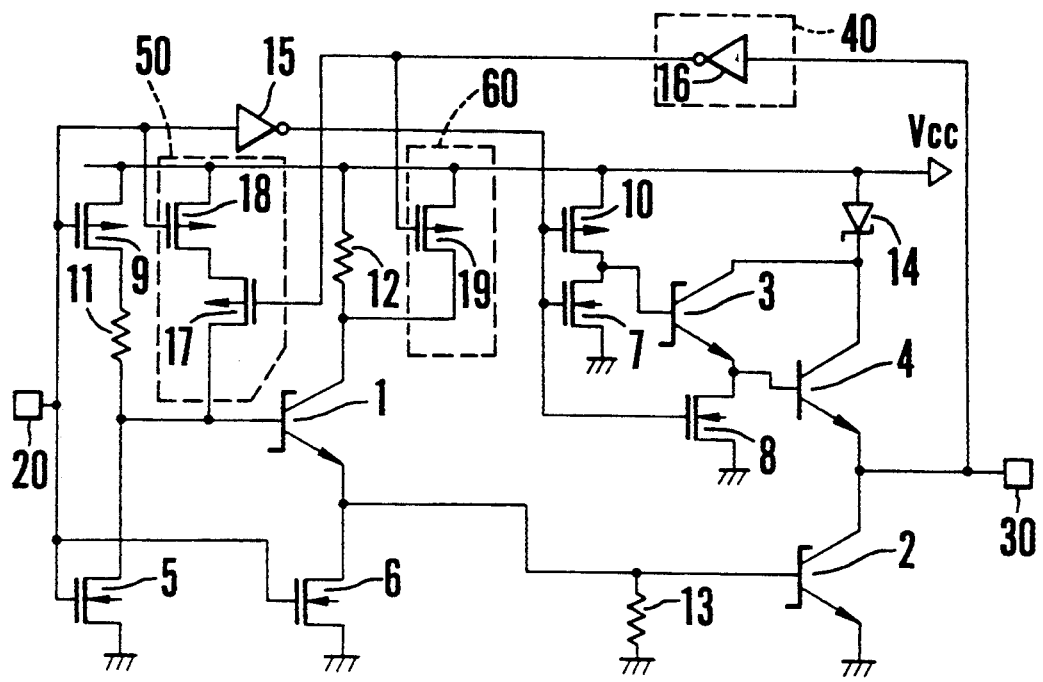
FIG. 3 is another preferred embodiment of the TTL logic circuit according to the present invention.

To solve this, an improved construction is provided as illustrated by a circuit of FIG. 3 as another preferred embodiment wherein the MOS transistor 9 has the identical small area to that of FIG. 1 but another P channel MOS transistor 18 is provided in series to the P channel MOS transistor 17, a gate of which transistor 18 is controlled by an input signal.

Hereby, the variable impedance means 50 is constructed by the P channel MOS transistors 17, 18 interconnected in series to each other, with the P channel MOS transistor 9 being the same as the prior one.

Figure 4:
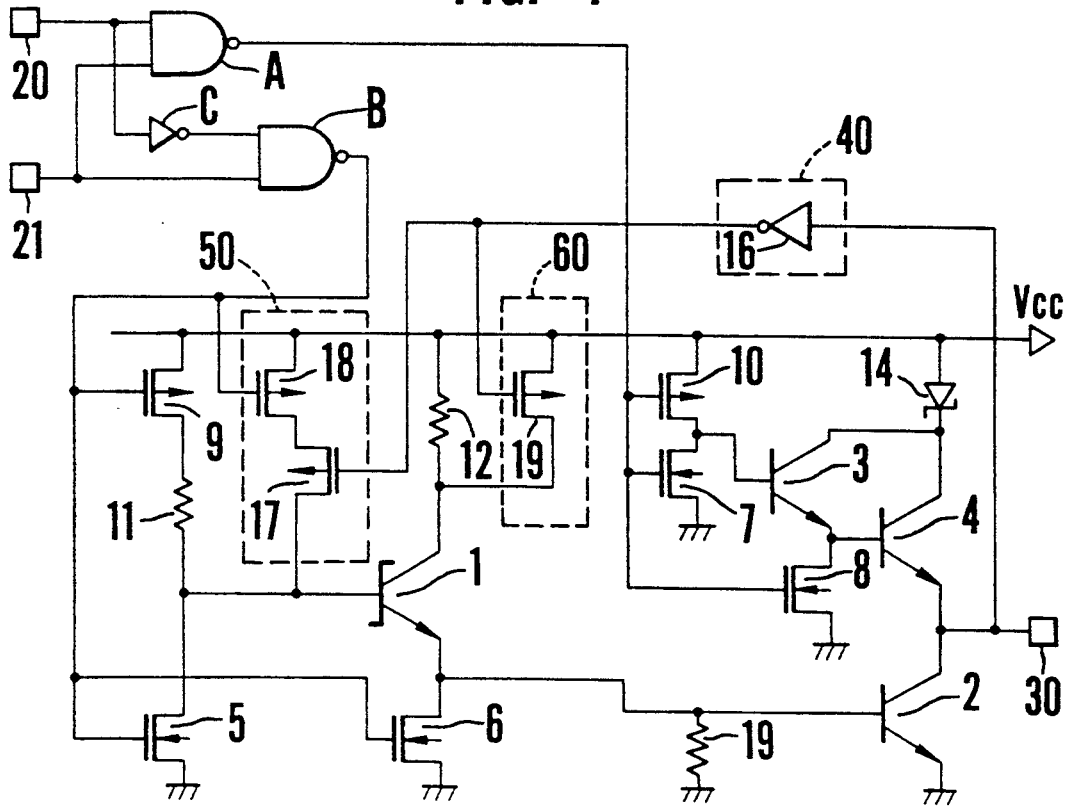
FIG. 4 is a still another preferred embodiment of the TTL logic circuit according to the present invention.

Referring to FIG. 4, there is illustrated a circuit diagram of still another preferred embodiment according to the present invention wherein like symbols shall be applied to like portions as those illustrated in FIGS. 2 and 3.

The embodiment is constructed by applying the present invention to a three-state TTL output circuit. To construct such a three-state type, another control terminal 21 is provided additionally to the input terminal 20 and further two-input NAND gates A, B and an inverter C are provided to execute logical operation between signals on the input terminals 20 and 21. With this construction, an output from the NAND gate A is applied to the gates of the MOS transistors 7, 8, 10 and an output from the NAND gate B is applied to the gates of the MOS transistors 5, 6, 9, and 18.

The present embodiment may be modified into another construction wherein the construction is the same as that of the embodiment of FIG. 3 but for the variable impedance circuit 50 the embodiment of FIG. 2 is employed.

Returning to FIG. 4, with the input terminal 21 being a low level, the NAND gates A, B output a high level, and hence the P channel MOS transistors 9, 18, 10 are switched off so that the N channel MOS transistors 5 through 8 are switched on. Hereby, the transistors 1 through 4 are all switched off together to bring the output terminal 30 into a high impedance state. Other operations are the same as those illustrated in FIG. 1.

According to the present invention, as described above, the circuit to supply the base and collector driving currents is controlled into a low impedance state upon the transition of the bipolar transistor from its off-to on-state, while it is controlled into a high impedance state upon the other states. Thus, there is ensured simultaneous realization of high speed operation and low power consumption.

What is claimed is:
1. A TTL logic circuit comprising:
 a first MOS transistor, to a gate of which an input signal is applied;
 a first bipolar transistor of predetermined conductivity type supplied with base driving current through a series circuit of said first MOS transistor and a first variable impedance means, and collector driving current through a second variable impedance means;
 a second bipolar transistor of predetermined conductivity type having its collector connected to a circuit output terminal and having its base driven by an emitter output from said first bipolar transistor; and
 output potential detector means for detecting a potential state of said circuit output terminal and controlling said first and second variable impedance means into high and low impedance state.

2. A TTL logic circuit according to claim 1, wherein said first variable impedance means comprises a second MOS transistor of the same conductivity type as that of said first MOS transistor having its gate to which an output from said output potential detector means is applied.

3. A TTL logic circuit according to claim 1, wherein said second variable impedance means comprises a third MOS transistor of the same conductivity type as that of said first MOS transistor having its gate to which the output of said output potential detector means is applied.

4. A TTL logic circuit according to claim 1, wherein said output potential detector means comprises a CMOS inverter.

5. A TTL logic circuit according to claim 1, wherein said first and second bipolar transistors are of NPN type and said first MOS transistor is of P type.

6. A TTL logic circuit according to claim 1, wherein said first and second bipolar transistors are Schottky barrier diode-equipped bipolar transistors.

7. A TTL logic circuit comprising:
 a first MOS transistor, to a gate of which a first input signal is applied;
 a first bipolar transistor of predetermined conductivity type supplied with base driving current through a series circuit of said first MOS transistor and a first variable impedance means, and collector driving current through a second variable impedance means;
 a second bipolar transistor of predetermined conductivity type having its collector connected to a circuit output terminal and having its base driven by an emitter output from said first bipolar transistor;
 output potential detector means for detecting a potential state of said circuit output terminal and controlling said first and second variable impedance means into high and low impedance state;
 a third bipolar transistor having its emitter connected to said circuit output terminal;
 a fourth bipolar transistor having its emitter connected to a base of said third bipolar transistor; and
 a second MOS transistor connected to a base of said fourth bipolar transistor and to a gate of which second MOS transistor a second input signal is input.

8. A TTL logic circuit according to claim 7, wherein said first to fourth bipolar transistors are of NPN type and said first and second MOS transistors are of P type.

9. A TTL logic circuit according to claim 7, further comprising a two-input first NAND gate having its one input terminal connected to a circuit input terminal of the TTL logic circuit, its other input terminal connected to a control terminal of the TTL logic circuit and its output terminal providing said first input signal for said first MOS transistor;
 a two-input second NAND gate having its one input terminal connected to said circuit input terminal through an inverter circuit, its other input terminal connected to said control terminal and its output terminal providing said second input signal for said second MOS transistor.

* * * * *